(12) United States Patent  (10) Patent No.: US 7,812,631 B2
Kim et al.  (45) Date of Patent:  Oct. 12, 2010

(54) SLEEP TRANSISTOR ARRAY APPARATUS AND METHOD WITH LEAKAGE CONTROL CIRCUITRY

(75) Inventors: Nam Sung Kim, Portland, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 536 days.

(21) Appl. No.: 11/609,823

(22) Filed: Dec. 12, 2006

(65) Prior Publication Data
US 2008/0136507 A1   Jun. 12, 2008

(51) Int. Cl.
*H03K 17/16*  (2006.01)
*H03K 19/003* (2006.01)

(52) U.S. Cl. .............................. 326/21; 326/40; 326/34; 327/544; 365/227

(58) Field of Classification Search ................... 326/21, 326/38, 39, 40, 34; 327/544; 365/227
See application file for complete search history.

(56) References Cited

U.S. PATENT DOCUMENTS

| | | | |
|---|---|---|---|
| 5,162,672 A * | 11/1992 | McMahan et al. ............. | 326/86 |
| 6,169,419 B1 | 1/2001 | De | |
| 6,191,606 B1 | 2/2001 | Ye | |
| 6,300,819 B1 | 10/2001 | De | |
| 6,329,874 B1 | 12/2001 | Ye | |
| 6,429,726 B1 | 8/2002 | Bruneau | |
| 6,448,840 B2 | 9/2002 | Kao | |
| 6,496,040 B1 | 12/2002 | Narendra | |
| 6,515,513 B2 | 2/2003 | Ye | |
| 6,593,799 B2 | 7/2003 | De | |
| 6,643,199 B1 | 11/2003 | Tang | |
| 6,707,708 B1 | 3/2004 | Alvandpour | |
| 6,724,648 B2 | 4/2004 | Khellah | |
| 6,724,649 B1 | 4/2004 | Ye | |
| 6,744,301 B1 | 6/2004 | Tschanz | |
| 6,801,463 B2 | 10/2004 | Khellah | |
| 6,806,726 B2 * | 10/2004 | Okada et al. ................. | 324/765 |
| 7,038,485 B2 * | 5/2006 | Nakashima et al. ............ | 326/30 |
| 7,096,433 B2 | 8/2006 | Tschanz | |
| 7,120,804 B2 | 10/2006 | Tschanz | |
| 7,247,930 B2 | 7/2007 | Narendra | |
| 7,268,569 B2 | 9/2007 | Vassighi | |
| 7,307,899 B2 * | 12/2007 | Khellah et al. ......... | 365/189.11 |
| 7,403,426 B2 | 7/2008 | Hamzaoglu | |
| 7,562,316 B2 | 7/2009 | Tschanz | |
| 7,671,456 B2 | 3/2010 | Narendra | |

* cited by examiner

*Primary Examiner*—Daniel D Chang
(74) *Attorney, Agent, or Firm*—Erik R. Nordstrom

(57) ABSTRACT

In some embodiments, an array of sleep transistors is provided, wherein a combination of said transistors may be enabled during an active mode to reduce leakage depending on the leakage characteristics of a chip or associated chip.

10 Claims, 3 Drawing Sheets

US 7,812,631 B2

SLEEP TRANSISTOR ARRAY APPARATUS AND METHOD WITH LEAKAGE CONTROL CIRCUITRY

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention relate generally to die-to-die process variation compensation for digital circuits.

In the past, typically only "slow" dies were discarded or binned into a lower value product. However, as transistor sizes have become ever smaller, the leakage power consumption during active modes has become a serious problem thereby resulting in some fast dies that are excessively leaky to also be discarded. Accordingly, it would be desirable to find a way to retain and use these "leaky" dies.

So-called "sleep" transistors have been employed now for several years to reduce or collapse supplies during sleep or standby modes, when a chip or chip portion is inactive, to reduce leakage (e.g., sub-threshold leakage) during inactive periods (e.g., sleep or standby modes. They are then turned on during an active mode to once again provide the supply for normal operation. Usually, the needed size of a sleep transistor is very large in order to minimize circuit performance degradation by the series resistance between, for example, VCC and virtual VCC (VVCC). Thus, in the actual physical layout, the large sleep transistor is typically implemented with many smaller transistors because such a large, single transistor usually cannot be made. Thus, when the chip (or functional block) is in an active mode, the transistors are all turned on and when in the sleep mode, they are all turned off.

As presented in some embodiments disclosed herein, it has been discovered that for fast but leaky dies, desired performance and leakage reduction can be attained at the same time by, if necessary, turning on a sub-combination of the sleep transistors during active modes, depending on the leakage characteristics of a particular chip or group of associated chips.

Figure 1:
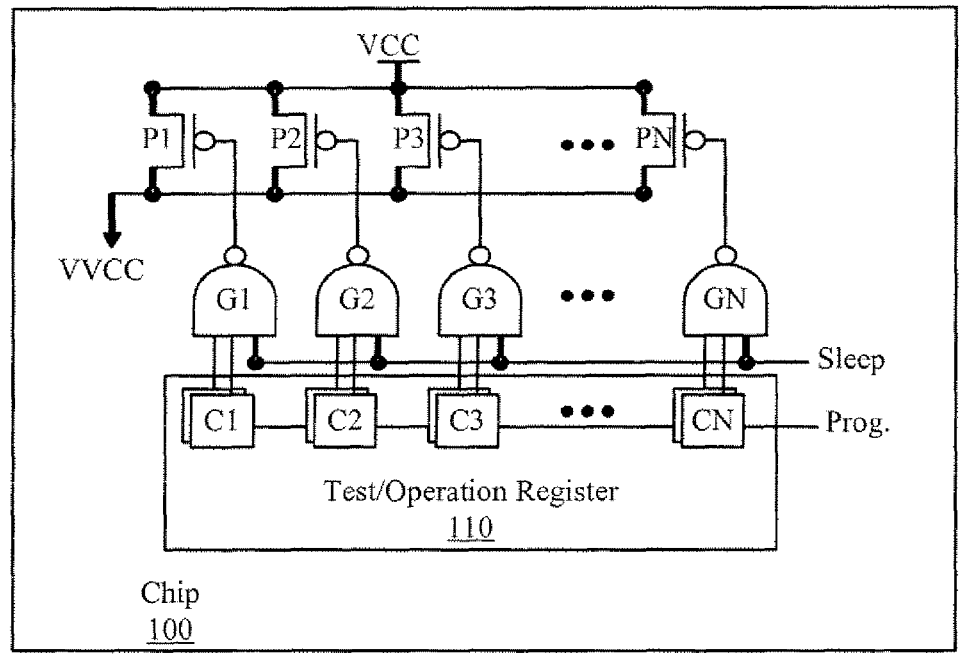
FIG. 1 is a schematic diagram of a chip with a virtual supply in accordance with some embodiments.

FIG. 1 shows a processor chip 100 with a programmable sleep transistor array in accordance with some embodiments. The chip comprises an array of sleep transistors P1 to PN, NAND gates G1 to GN, and a test/operation register 110 comprising memory cells (or cell sets) C1 to CN. The sleep transistors P1 to PN are PMOS transistors that are coupled between a high supply reference (VCC) and the plurality of NAND) gates G1 to GN, as indicated. The NAND gates each have two inputs, one coupled to a sleep mode signal (Sleep) and the other coupled to a memory cell (one of C1 to CN) associated with the particular NAND gate and sleep transistor combination.

(The term "PMOS transistor" refers to a P-type metal oxide semiconductor field effect transistor. Likewise, "NMOS transistor" refers to an N-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

The number of sleep transistors in a sleep transistor array will generally depend on the size of the chip or functional block within the chip being powered by the transistors. They may be spread over the area for which they are supplying power, or alternatively, they could be relatively close to one another.

The test/operation register 110 comprises cells (or cell sets) C1 to CN. (As used herein, the term "cell" is intended to refer to one, two or several cells coupled, or previously coupled, to a common gate and/or sleep transistor. Accordingly, cell or cell sets are intended to be used interchangeably.) The test/operation register has a signal (Prog.) to program the cells, e.g., via a serial link accessible outside of the chip such as with a scan register. The test/operation register should be programmable during a test phase (e.g., during the manufacturing process) and should also be programmable for normal operation. (In some cases, these programmability capabilities may be achieved with the same structure.) Accordingly, a cell for each location may comprise more than one actual cell (e.g., a scan register cell for test phase and a fuse cell for operation) or it may comprise a single cell such as an SRAM or flash cell that can be programmed and re-programmed for testing and for normal operation, e.g., during a start-up phase. Thus, the memory cells C1 to CN may comprise any suitable memory structures along these lines including but not limited to volatile programmable cells such as SRAM cells, re-programmable non-volatile cells such as flash, NVRAM, magnetic RAM, polymer RAM; and non-volatile one-time-programmable structures such as transistor-based PROM cells, EPROM cells, fuses, and the like.

In the depicted figure, each cell comprises first and second cells, one that is part of the scan register for testing the chip and one that is a programmable, non-volatile cell (e.g., fuse) to be programmed during the manufacturing process after testing for operation of the processor chip 100. More on the testing phase will be discussed below with regard to FIG. 2.

A Sleep signal controls the sleep transistors that have been designated for active use once the cells are programmed for normal operation (e.g., burned at the factory or loaded at start-up). In the depicted embodiment, when the Sleep signal is asserted (Low), then the NAND gates G1 to GN all output a High, which turn off the sleep transistors. Conversely, when the Sleep signal is de-asserted (High) during an active mode, the NAND gates in effect are then controlled by the cells, C1 to CN, that are used for normal operation. If a sleep transistor was designated to be on during an active mode, then its cell outputs a High to its NAND gate, causing the transistor to be turned on. Alternatively, if a sleep transistor was designated to be off, then its cell outputs a Low, causing the transistor to be turned off during the active mode.

Figure 2:
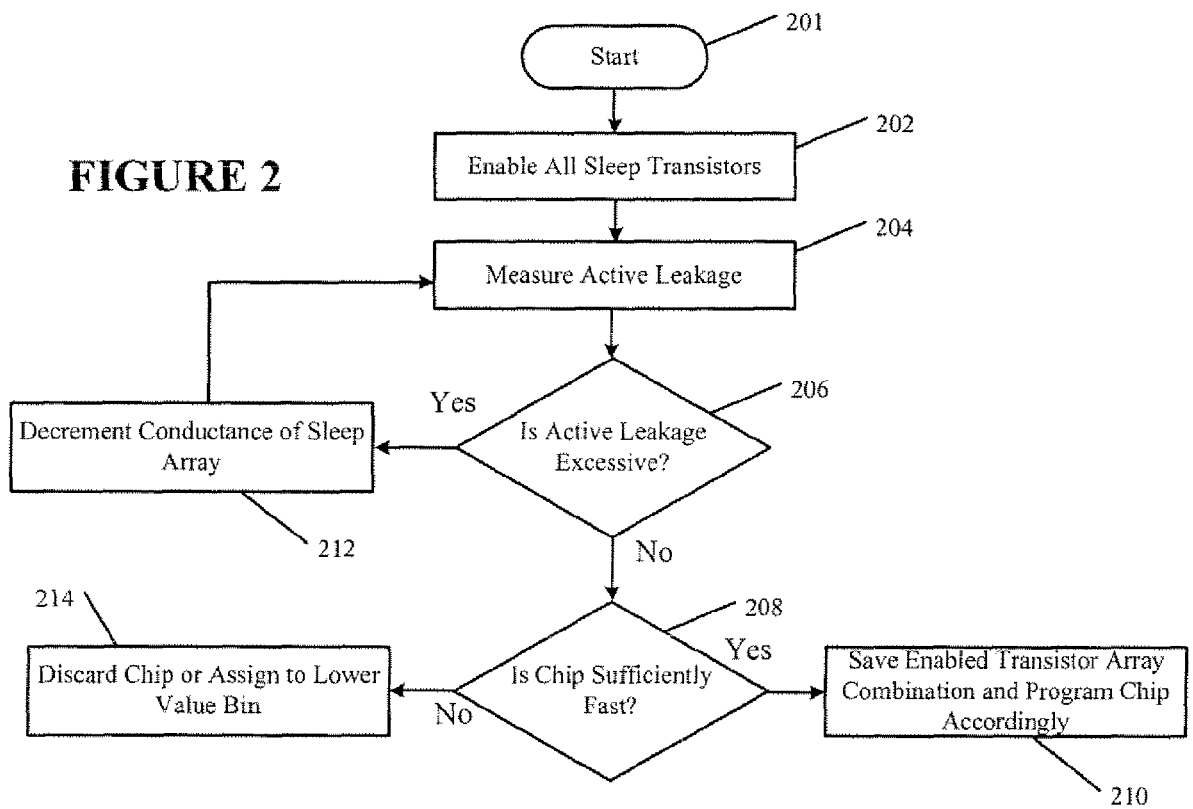
FIG. 2 is a routine for identifying a suitable combination of enabled sleep transistors in a programmable sleep transistor array in accordance with some embodiments.

FIG. 2 shows a routine 201 for testing a chip to determine sleep transistor combinations to be turned on during an active mode. For example, routine 201 could be performed during the manufacturing process to test chips (or representative chips from a chip's lot) to determine the amount of leakage in a chip during an active mode.

Initially, at 202, each sleep transistor in an array is enabled. For example, they may each be enabled by programming each cell in a scan register with a '1. Next, at 204, the active leakage in the chip (or functional block supplied by the sleep transistor's virtual supply) is measured. This may be done, for example, by comparing measured consume power for a given processing task against expected power consumption.

At 206, it is determined if the active leakage is excessive. If so, then at 212, the sleep transistor array conductance is decremented, and the routine loops back to 204 where it once again measures the active leakage and proceeds as discussed, i.e., it proceeds to decision step 206.

If at 206, it was determined that the leakage was not excessive, then the routine proceeds to 208 where it determines (or confirms) that the chip is sufficiently fast. (This may have already been done or may be done in a separate test.) If it is sufficiently fast, then at 210, it stores the enabled transistor array combination and takes action, if necessary, so that it will be programmed into the register 110 (at least the operation portion, if separate from the test portion). For example, the combination may be burned into the register if it is one-time-programmable memory, or it may be stored to be part of a start-up routine to be programmed into the register when the chip starts up. On the other hand, if at 208 it was determined that the chip was not sufficiently fast, then at 214, the chip may be discarded or otherwise devalued.

Figure 3:
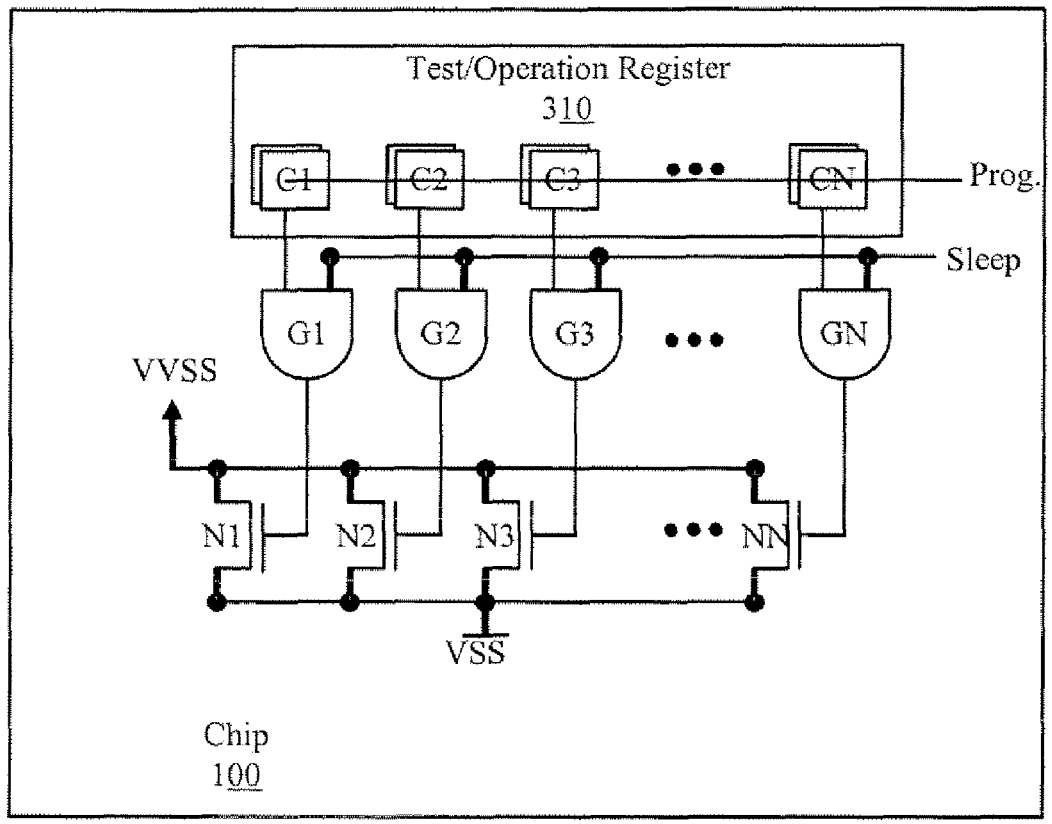
FIG. 3 is a schematic diagram of a chip with a virtual low supply reference in accordance with some embodiments.
Figure 4:
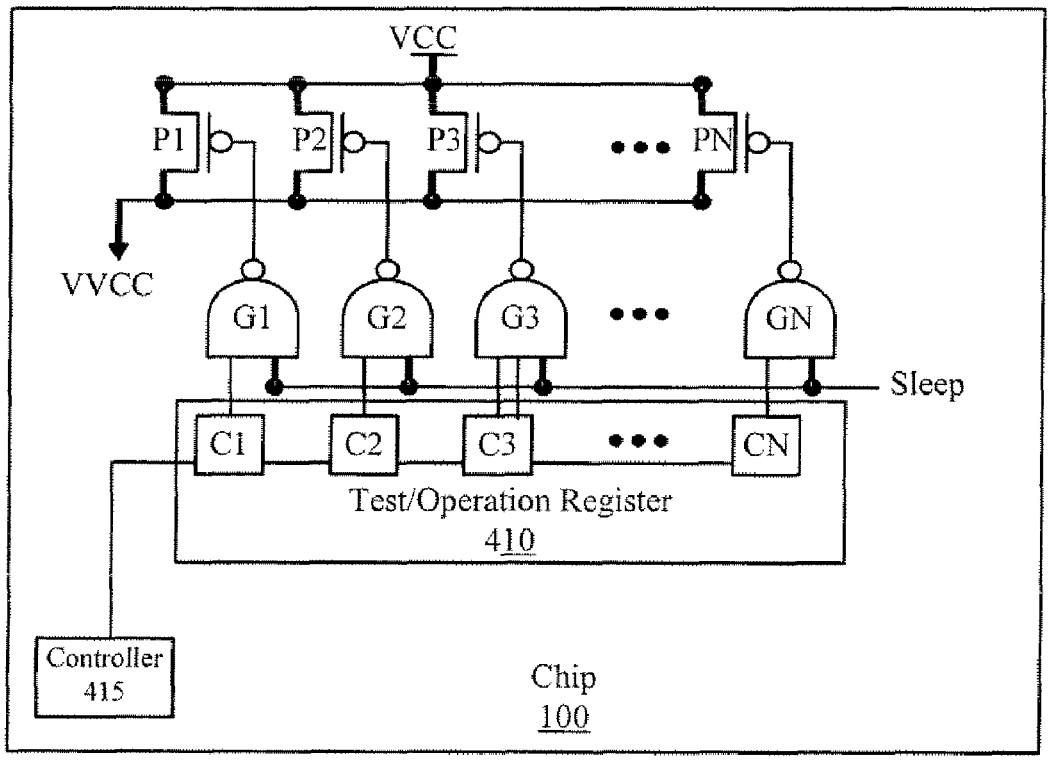
FIG. 4 is a schematic diagram of a processor with a virtual supply reference in accordance with some other embodiments.

FIGS. 3 and 4 illustrate the processor chip 100 in accordance with some other embodiments as specifically shown in FIG. 1. In FIG. 3, NMOS transistors N1 to NN are used instead of PMOS transistors to provide a virtual low supply reference (VVSS) from a low supply reference (VSS). In this way, depending on the combination of enabled transistors, an elevated low supply reference can be provided during an active mode to reduce leakage from "below" rather than from the top. In accordance therewith, AND gates, G1 to GN, are used instead of NAND gates to perform the appropriate logic.

FIG. 4 shows a sleep transistor array that is programmed via a test/operation register 410 that specifically illustrates one cell per transistor. Each cell can be used both for testing and operation. For example, the register could be implemented with a register of SRAM or non-volatile RAM (NVRAM) cells. The register 410 is coupled to a controller 415 (or control logic section), which can program it during the test phase and at start-up when it is to be operated, if necessary. For example, the controller could have firmware that causes it to execute an algorithm (e.g., in accordance with routine 201), either with or without external stimuli, in order to determine a suitable array of enabled sleep transistors. Once determined, an enabled transistor combination could then be saved to be programmed at startup or during the manufacturing process, depending on the particular type of memory use to implement register 410.

Figure 5:
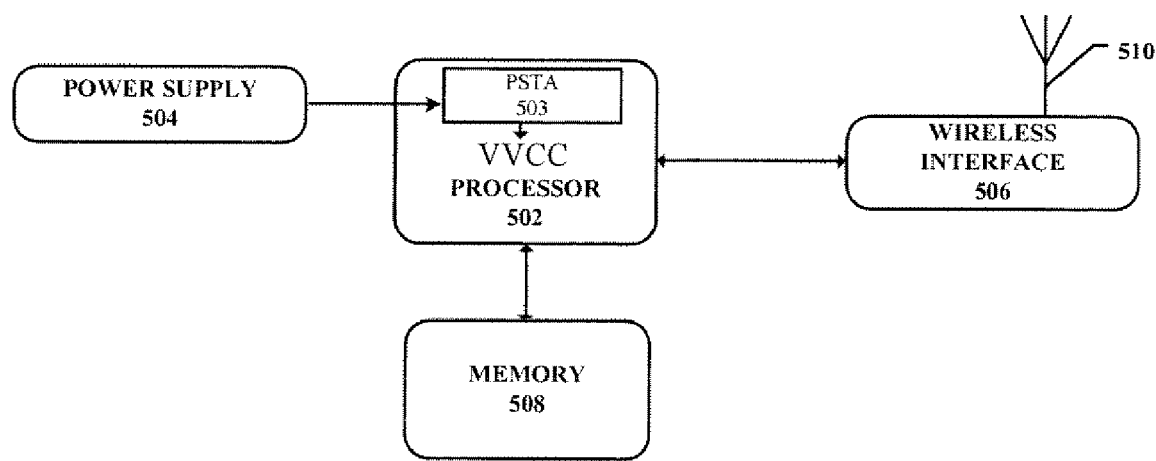
FIG. 5 is a block diagram of a computer system having a microprocessor with at least one programmable sleep transistor array in accordance with some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. The wireless interface 506 is coupled to an antenna 510 to communicatively link the processor through the wireless interface chip 506 to a wireless network (not shown). Microprocessor 502 comprises a programmable sleep transistor array (PSTA) 503 to provide a virtual high supply (VVCC) to one or more functional blocks within the processor 502 in order to reduce leakage during an active mode.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a plurality of sleep transistors to provide a virtual supply during an active mode;
   a memory to enable a predetermined combination of said sleep transistors during the active mode based on active mode leakage; and
   a controller to program the memory at startup to enable the predetermined combination during the active mode.

2. The chip of claim 1, in which the memory comprises a scan register.

3. The chip of claim 2, in which the memory further comprises a plurality of one time programmable cells.

4. The chip of claim 1, in which the virtual supply is a virtual high supply reference, and the sleep transistors comprise PMOS transistors.

5. The chip of claim 4, in which the predetermined combination is determined based on active leakage measurements of a die associated with the chip.

6. The chip of claim 1, in which the virtual supply is provided to a portion of the chip.

7. A method comprising:
   measuring a chip's active mode leakage;
   if necessary, reducing the conductance of a sleep transistor array to identify a combination of enabled sleep transistors resulting in satisfactory leakage; and
   programming the chip so that the identified combination of sleep transistors is enabled during active modes when the chip is in operation, wherein measuring comprises initially enabling each transistor in the array.

8. The method of claim 7, in which programming comprises burning an array of one time programmable memory cells to store the identified combination.

9. The method of claim 7, in which programming comprises storing the identified combination in firmware to be executed by a controller in the chip.

10. The method of claim 7, further comprising confirming that the chip is sufficiently fast.

* * * * *